United States Patent
Lin et al.

(10) Patent No.: US 8,279,570 B2
(45) Date of Patent: Oct. 2, 2012

(54) ESD PROTECTION FOR RF CIRCUITS

(75) Inventors: Chun-Yu Lin, Hualien (TW); Li-Wei Chu, Hsinchu (TW); Ming-Dou Ker, Zhubei (TW); Ming Hsien Tsai, Sindian (TW); Tse-Hua Lu, Zhubei (TW); Ping-Fang Hung, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 66 days.

(21) Appl. No.: 12/908,064

(22) Filed: Oct. 20, 2010

(65) Prior Publication Data

US 2012/0099228 A1 Apr. 26, 2012

(51) Int. Cl.
*H02H 3/20* (2006.01)
*H02H 9/04* (2006.01)

(52) U.S. Cl. ......... 361/91.5; 361/56; 361/91.1; 361/111

(58) Field of Classification Search .............. 361/56, 361/91.1, 91.5, 111
See application file for complete search history.

(56) References Cited

U.S. PATENT DOCUMENTS

| | | | | |
|---|---|---|---|---|
| 6,509,779 B2 * | 1/2003 | Yue et al. | | 327/310 |
| 6,861,680 B2 | 3/2005 | Ker et al. | | |
| 6,885,534 B2 * | 4/2005 | Ker et al. | | 361/113 |
| 7,009,826 B2 | 3/2006 | Ker et al. | | |
| 7,023,677 B2 | 4/2006 | Ker et al. | | |
| 7,023,678 B2 | 4/2006 | Ker et al. | | |
| 2009/0195946 A1 * | 8/2009 | Kleveland | | 361/56 |

OTHER PUBLICATIONS

Hyvonen et al. Diode-Based Tuned ESD Protection for 5.25-GHz CMOS LNAs, 2005, ESD assiciation, EOS/ESD Symposium, 2005.*
Ker et al. ESD Protection Design With Low-Capacitance Consideration for High-Speed/High-Frequency I/O Interfaces in Integrated Circuits, 2007, Bentham Science Publichers Ltd., Recent Patents on Engineering, 2007, 1, 000-000.*
Ker, M.D. et al., "A Novel LC-Tank ESD Protection Design for Giga-Hz RF Circuits", IEEE Radio Frequency Integrated Circuits Symposium, 2003, MO1C-5, pp. 115-118.
Hyvonen, S. et al., "Comprehensive ESD protection for RF inputs" Microelectronics Reliabilty, 2005, 45:245-254.
Mergens, M. et al., "Speed Optimized Diode-Triggered SCR (DTSCR) for RF EDS Protection of Ultra-Sensitive IC Notes in Advanced Technologies", IEEE Transactions on Device and Materials Reliability, Sep. 2005, 5 (3):532-542.
Lin, C.Y. et al., "Self-Matched ESD Cell in CMOS Technology for 60-GHz Broadband RF Applications", IEEE Radio Frequency Integrated Circuits Symposium, 2010, RTUIF-20, pp. 573-576.

* cited by examiner

*Primary Examiner* — Rexford Barnie
*Assistant Examiner* — Zeev V Kitov
(74) *Attorney, Agent, or Firm* — Duane Morris LLP

(57) ABSTRACT

An electrostatic discharge (ESD) circuit, adaptive to a radio frequency (RF) device, which includes a RF circuit coupled between a VDD power rail and a VSS power rail and having a RF I/O pad, includes an ESD clamp circuit coupled between a VDD power rail node and the VSS power rail node and a LC-tank structure coupled between the VDD power rail node and the VSS power rail node and to the RF I/O pad. The LC-tank structure includes a first ESD block between the VDD power rail node and the RF I/O pad, and a second ESD block between the VSS power rail node and the RF I/O pad. At least one of the first and second ESD blocks includes a pair of diodes coupled in parallel with each other and an inductor coupled in series with one of the pair of diodes.

20 Claims, 5 Drawing Sheets

10

100

100A

100D

100E

ESD PROTECTION FOR RF CIRCUITS

TECHNICAL FIELD

The present invention relates to electrostatic discharge (ESD) protection designs for RF circuits.

BACKGROUND

Electrostatic discharge (ESD) occurs when large voltage pulses due to static electricity occur at the leads of an integrated circuit (IC). These large voltage pulses can cause the breakdown of insulating layers, short circuiting between conducting paths, or overheating or evaporation of metal or silicon pathways within the IC leading to the failure of the IC. Increases in IC density have reduced the width of IC traces and the gate dielectric thickness of active devices which have made ICs more susceptible to damage from ESD events.

During the processing and handling of individual packaged ICs, circuits connected to external pins, or external bumps in some IC packages, can be exposed to very high voltages. Peripheral circuits therefore use special electrostatic discharge (ESD) protection circuits coupled to external pins. However, ESD protection devices can cause signal loss at the inputs and outputs of the operating circuit. Some design techniques have been implemented to reduce this signal loss. Many of these designs use large ESD diodes. However, large diodes have large parasitic capacitances, which cause performance reductions. There is a tradeoff between parasitic capacitance and ESD robustness.

BRIEF DESCRIPTION OF THE DRAWINGS

The accompanying drawings illustrate various embodiments of ESD protection circuits, as well as other information pertinent to the disclosure, in which.

DETAILED DESCRIPTION

This description of the exemplary embodiments is intended to be read in connection with the accompanying drawings, which are to be considered part of the entire written description. Terms concerning coupling (electrical or mechanical) and the like, such as "coupled," "connected" and "interconnected," refer to a relationship wherein structures are secured, attached or communicate to one another either directly or indirectly through intervening structures, unless expressly described otherwise.

Figure 1:
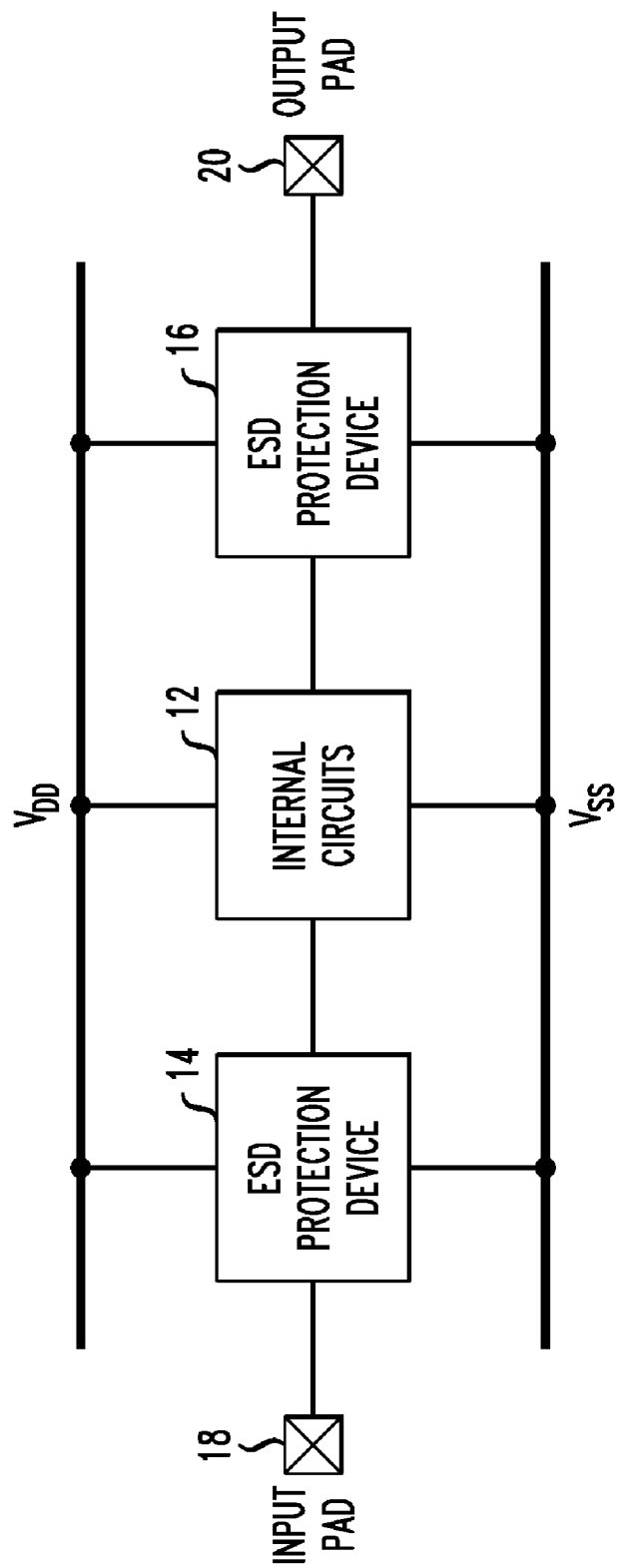
FIG. 1 is a schematic block diagram of an RF device having ESD protection at input and output pads.

FIG. 1 is a schematic block diagram of an RF device 10. The RF device includes an operating device, labeled internal RF circuit 12, that is coupled between input pad 18 and output pad 20 and between a pair of power rails, e.g., Vdd and Vss. In embodiments, the internal circuit has an operating frequency in the gigahertz frequency band. In one example, the operating device could have an operating frequency in the 60 GHz frequency band that has been allocated for unlicensed usages in next-generation wireless communications, though it should be understood that the ESD protection scheme disclosed herein is not limited to any particular gigahertz frequency band. The RF device 10 includes a pair of ESD protection devices. A first ESD protection device 14 is coupled between the input pad 18 and the internal RF circuit 12, and a second ESD protection device 16 is coupled between the output pad 20 and the internal RF circuit 12. The ESD protection scheme described below can be implemented for the RF device 10 shown in FIG. 1.

Figure 2:
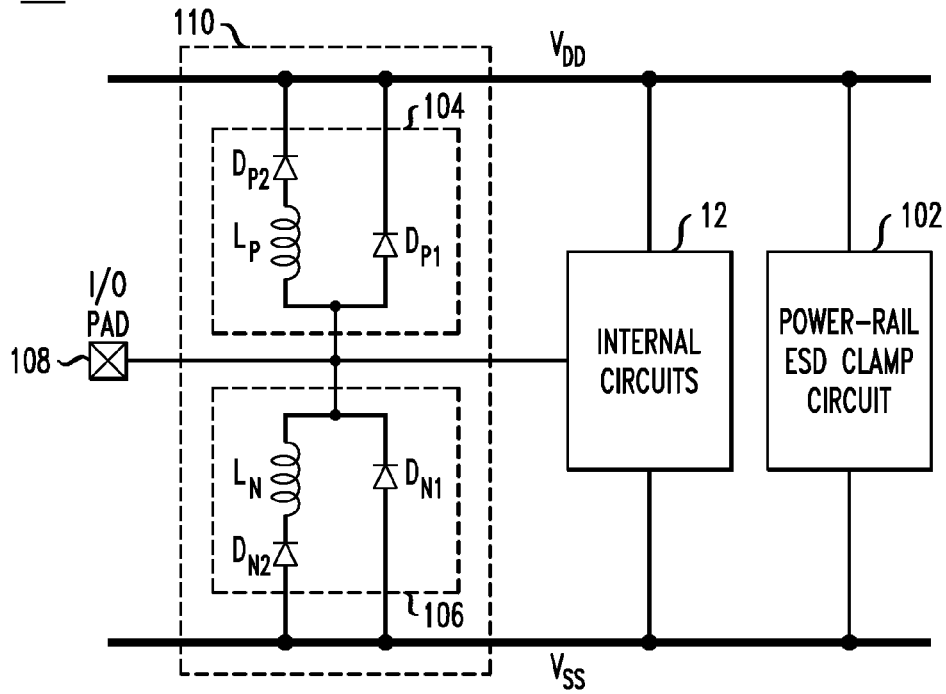
FIG. 2 illustrates an embodiment of an RF device having ESD protection including a LC-tank structure.

Turning to FIG. 2, an ESD protection scheme is shown in connection with an RF device 100. More specifically, the ESD protection scheme includes a LC-tank ESD protection device in the I/O port 108 of the RF device 100 and a power-rail ESD clamp circuit. The I/O port 108 can be either an input or output pad (pin or other connector) as described above in connection with FIG. 1. The RF device 100 has internal RF circuits 12 and power rail ESD clamp circuit 102 coupled between the Vdd and Vss power rails. Power rails Vdd and Vss may be coupled to Vdd and Vss pads, respectively (not shown).

The LC-tank structure 110 includes two ESD blocks, including ESD block 106 coupled between I/O pad 108 and the VSS power rail and ESD block 104 coupled between I/O pad 108 and Vdd power rail. The ESD block 106 includes two parallel current paths between I/O pad 108 and the Vss power rail. The first current path includes diode $D_{N1}$ and the second current path includes diode $D_{N2}$ coupled in series with inductor $L_N$. The ESD block 104 also includes two parallel current paths between I/O pad 108 and the Vdd power rail. The first current path includes diode $D_{P1}$ and the second current path includes diode $D_{P2}$ in series with inductor $L_P$.

The loop including inductor $L_P$ and diodes $D_{P1}$ and $D_{P2}$ form an LC-tank with the parasitic capacitance from $D_{P1}$ and $D_{P2}$ providing the capacitive element of the LC circuit. The loop including inductor $L_N$ and diodes $D_{N1}$ and $D_{N2}$ are connected in parallel and form an LC-tank using the parasitic capacitance of $D_{N1}$ and $D_{N2}$. The LC-tanks are adapted to resonate at the operating frequency of the internal RF circuits 12. When the LC-tanks are resonant to this RF frequency, there is infinite impedance (i.e., the LC tanks appear as open circuits), thus minimizing the power gain loss. Therefore, the ESD protection circuit does not interfere with the operation of the internal RF circuits 12.

Under an ESD event at the I/O pad 108, the ESD current will be discharged through either ESD block 104 or 106. That is, for a positive ESD event, inductor $L_P$ acts as a short and the ESD current is discharged through both $D_{P1}$ and $D_{P2}$, which are on simultaneously and operating under a forward-biased condition. Robust ESD protection can be achieved using diodes $D_{P1}$ and $D_{P2}$ in parallel with very low on-resistance, compared with a single diode in series with an LC-tank circuit. That is, assuming by way of example only, that each diode has an on-resistance of X. Placing the diodes in parallel reduces the on-resistance of the LC-tank structure by half to X/2. Similarly, for a negative ESD event at the I/O pad 108, inductor $L_N$ acts as a short and the ESD current is discharged through both $D_{N1}$ and $D_{N2}$, which are on simultaneously and operating under a forward-biased condition. Robust ESD protection can be achieved using diodes $D_{N1}$ and $D_{N2}$ in parallel with very low on-resistance compared with a single diode in series with an LC-tank circuit.

To avoid the diodes operating under breakdown condition during the PS-mode (positive-to-Vss ESD stress) and ND-mode (negative-to-Vdd ESD stress), which results in a lower ESD protection level, a turn-on efficient Vdd-to-Vss ESD clamp circuit 102 is provided into the ESD protection circuit. This clamp circuit 102 can significantly increase the overall ESD protection.

When the RF input pad 108 is zapped with one of four ESD modes, i.e., PS, ND, PD (positive-to-VDD ESD stress) or NS (negative-to-VSS ESD stress), the diodes of one of the tank structures 106 or 104 operate under forward-biased condition to discharge the ESD current. Diodes operating under forward-biased condition can sustain a much higher ESD level than those operating under reverse-biased breakdown condition. The ESD clamp circuit 102 is turned on when the I/O pad 108 is zapped with PS-mode or ND-mode ESD stresses. The ESD current is bypassed through the forward-biased diodes $D_{P1}$ and $D_{P2}$ and the turned-on ESD clamp circuit 102 between the Vdd/Vss power rails, because the diodes $D_{N1}$ and $D_{N2}$, in PS-mode ESD stress, do not operate under the breakdown condition. Similarly, the diode $D_{N1}$ and $D_{N2}$ operate under the forward-biased condition with the ESD clamp circuit 102, between the Vdd/Vss power rails, to safely discharge the ND-mode ESD current.

The ESD clamp circuit 102 can be especially designed with larger device dimensions to sustain a high-level ESD. Although the large-dimension clamp circuit 102 has a large junction capacitance, this capacitance does not contribute to the capacitance at the RF I/O pad 108. By applying this ESD protection design, the RF I/O pad 108 can sustain much higher levels of ESD in the four aforementioned ESD stress modes.

The ESD protection circuit shown in FIG. 1 can achieve both good RF performance and high ESD robustness. The on-resistance during ESD zapping is low because of the use of multiple diode paths. And the inductors $L_P$ an $L_N$ can be sized to compensate for the parasitic capacitances induced by the ESD protection diodes in the ESD blocks 104, 106. FIG. 3 shows a signal loss verses frequency graph illustrating simulation results obtained from the simulation of the RF device of FIG. 2. As can be seen from FIG. 3, the simulated design showed minimal signal loss centered around about 40 GHz. It should be understood that the components of the ESD protection scheme can be adapted for other center frequencies.

Figure 2A:
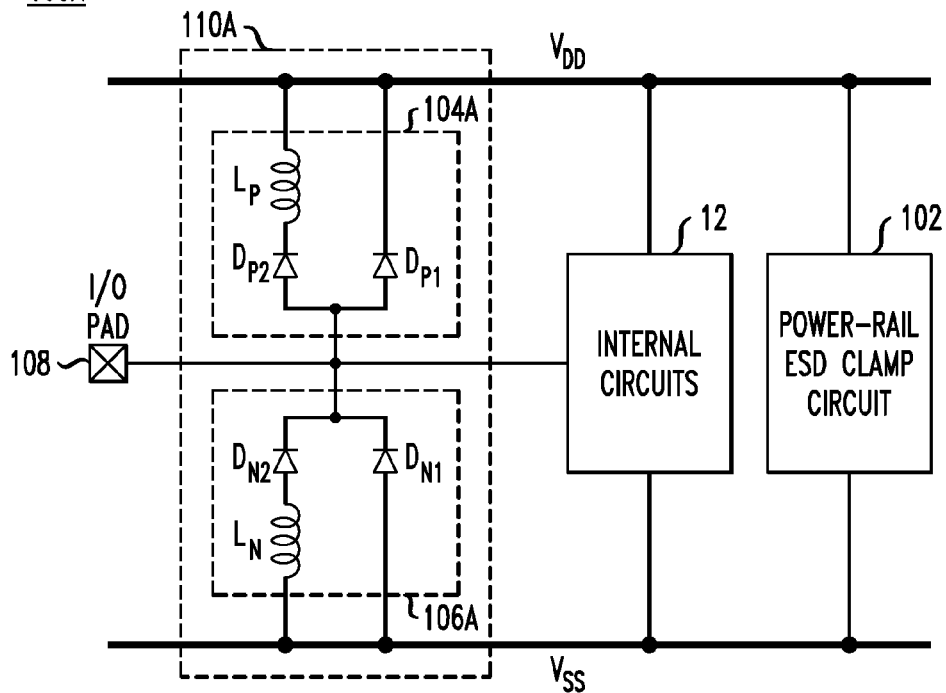
FIG. 2A illustrates an alternative embodiment of the RF device of FIG. 2.

FIG. 2A illustrates an RF device 100A having an alternative embodiment of a LC-tank structure 110A. The LC-tank structure 110A is identical to that of LC-tank structure 110 only the positions of $L_P$ and $D_{P2}$ in ESD block 104A are swapped with respect to that shown in FIG. 2 (i.e., the anode of $D_{P2}$ is connected to the I/O pad 108 and the cathode is connected to $L_P$) and the positions of $L_N$ and $D_{N2}$ in ESD block 106A are swapped with respect to that shown in FIG. 2 (i.e., the cathode of $D_{N2}$ is connected to the I/O pad 108 and the anode is connected to $L_N$). The operation of LC-tank structure 110A is identical to that of LC-tank 110.

Figure 3A:
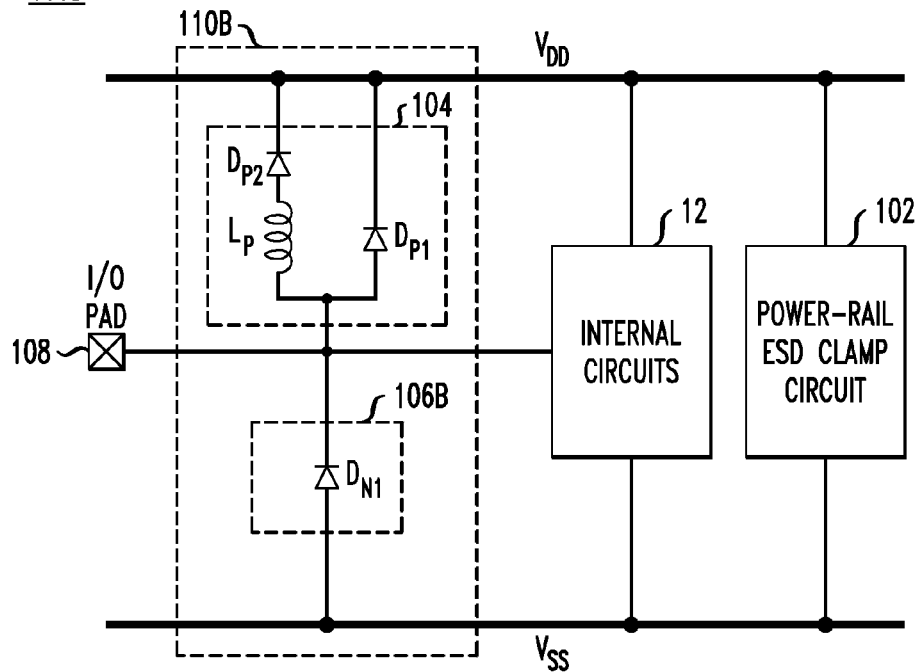
FIG. 3A illustrates another embodiment of an RF device having ESD protection including a LC-tank structure.

FIG. 3A illustrates an RF device 100B having an alternative embodiment of a LC-tank structure 110B. The LC-tank structure 110B is identical to that of LC-tank structure 110 except ESD block 106B includes one current path between I/O pad 108 and the VSS power rail. This current path includes diode $D_{N1}$. In this embodiment, one inductor $L_P$ can be sized to compensate for all or some of the parasitic capacitance at the I/O pad 108, i.e., for parasitic capacitances induced by $D_{P1}$, $D_{P2}$ and/or $D_{N1}$. This embodiment offers area savings over embodiments having multiple inductors $L_P$ and $L_N$.

Figure 3B:
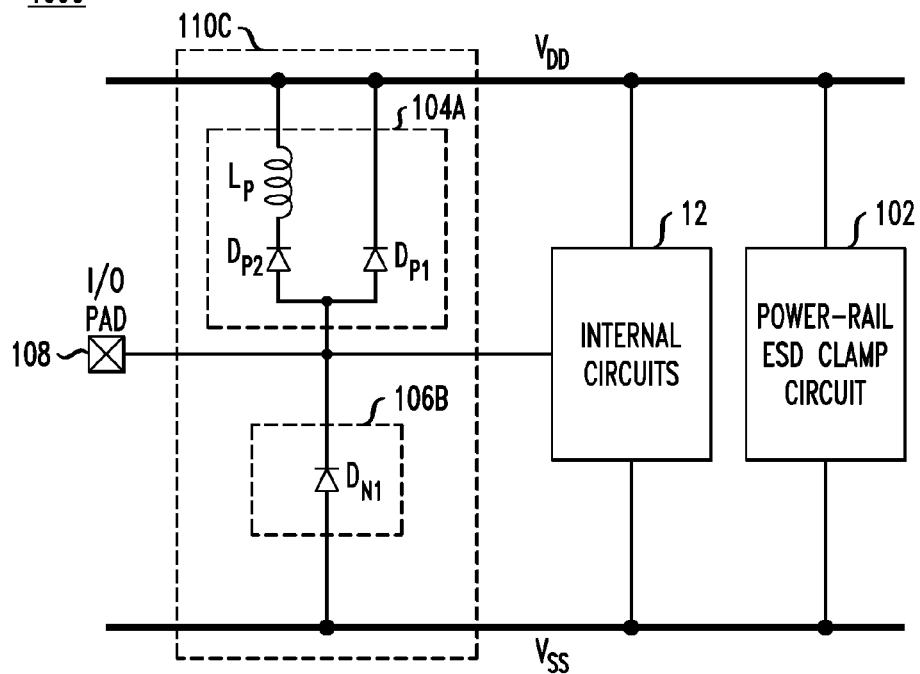
FIG. 3B illustrates an alternative embodiment of the RF device of FIG. 3.

FIG. 3B illustrates an RF device 100C having an alternative embodiment of a LC-tank structure 110C. The LC-tank structure 110C is identical to that of LC-tank structure 110B only it includes ESD block 104A rather than ESD block 104. The operation of LC-tank structure 110C is identical to that of LC-tank 110B.

Figure 4A:
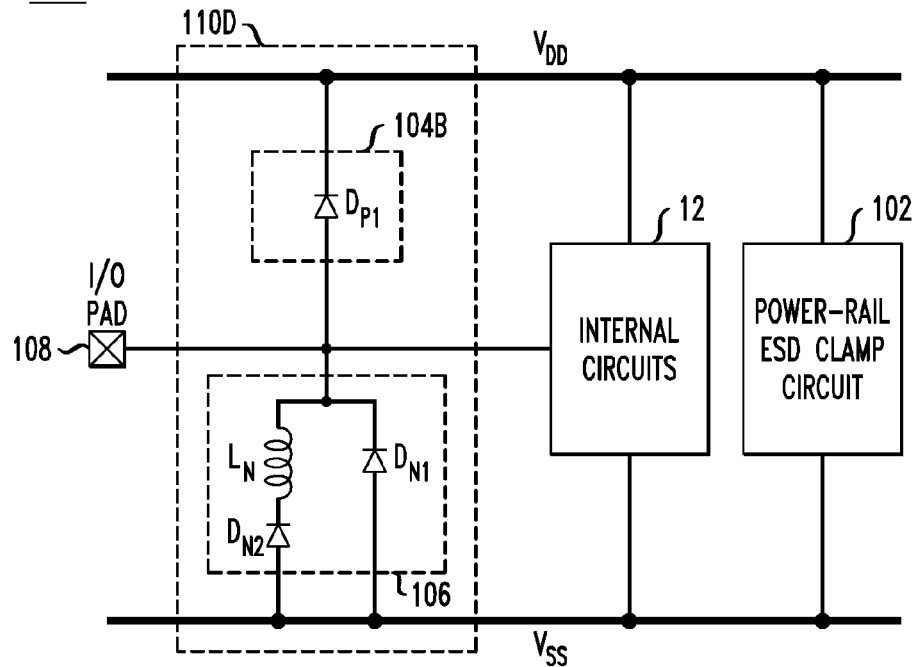
FIG. 4A illustrates yet another embodiment of an RF device having ESD protection including a LC-tank structure.

FIG. 4A illustrates an RF device 100D having an alternative embodiment of a LC-tank structure 110D. The LC-tank structure 110D is identical to that of LC-tank structure 110 except ESD block 104B includes one current path between I/O pad 108 and the VDD power rail. This current path includes diode $D_{P1}$. In this embodiment, one inductor $L_N$ can be sized to compensate for all or some of the parasitic capacitance at the I/O pad 108, i.e., for parasitic capacitances induced by $D_{N1}$, $D_{N2}$ and/or $D_{P1}$. This embodiment offers area savings over embodiments having multiple inductors $L_P$ and $L_N$.

Figure 4B:
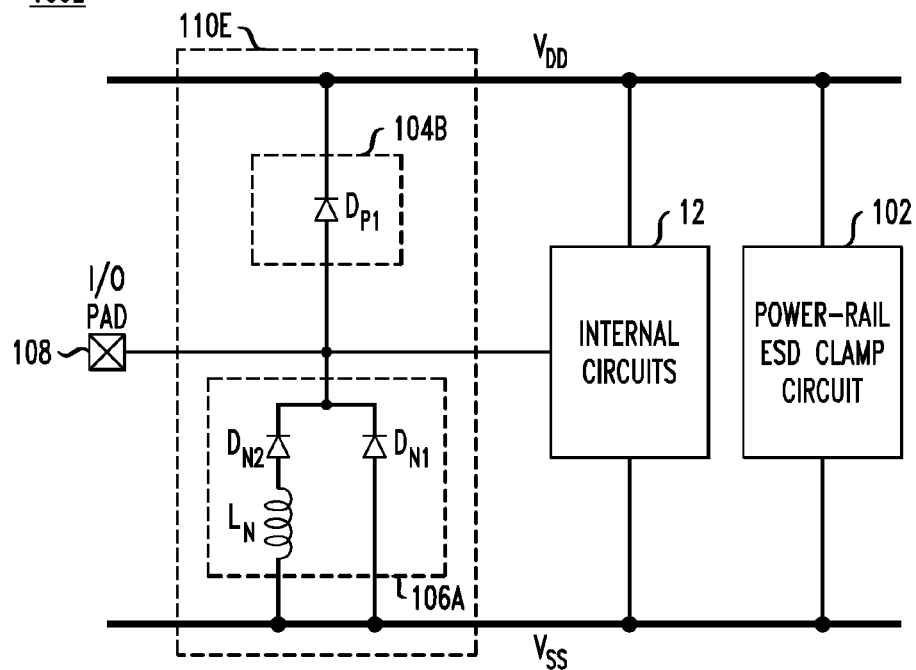
FIG. 4B illustrates an alternative embodiment of the RF device of FIG. 4.
Figure 5:
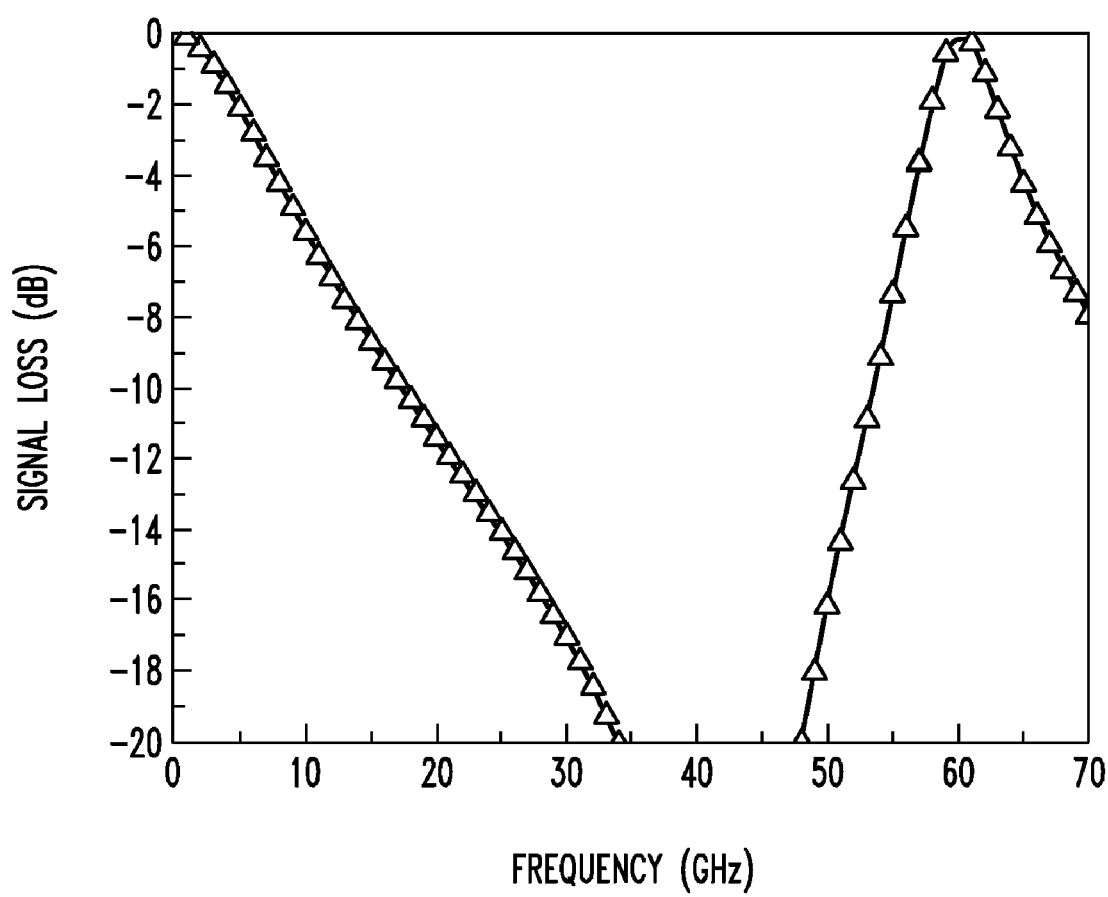
FIG. 5 illustrates simulation results illustrating signal loss verses frequency for an RF device having ESD protection including a LC-tank structure.

FIG. 4B illustrates an RF device 100A having an alternative embodiment of a LC-tank structure 110E. The LC-tank structure 110E is identical to that of LC-tank structure 110D only it includes ESD block 106A rather than ESD block 106. The operation of LC-tank structure 110E is identical to that of LC-tank 110D.

Per the foregoing description, in one embodiment an electrostatic ESD circuit, adaptive to a RF device, which includes a RF circuit coupled between a VDD power rail and a VSS power rail and having a RF I/O pad, includes an ESD clamp circuit coupled between a VDD power rail node and the VSS power rail node and a LC-tank structure coupled between the VDD power rail node and the VSS power rail node and to the RF I/O pad. The LC-tank structure includes a first ESD block between the VDD power rail node and the RF I/O pad, and a second ESD block between the VSS power rail node and the RF I/O pad. At least one of the first and second ESD blocks includes a pair of diodes coupled in parallel with each other and an inductor coupled in series with one of the pair of diodes.

A RF device is also provided including a circuit coupled between a VDD power rail and a VSS power rail and having a RF I/O pad; an ESD clamp circuit coupled between the VDD power rail and the VSS power rail; and a LC-tank structure coupled between the VDD power rail and the VSS power rail and between the RF I/O pad and the RF circuit. The LC-tank structure includes a first ESD block between the VDD power rail and the RF I/O pad, and a second ESD block between the VSS power rail and the RF I/O pad, wherein at least one of the first and second ESD blocks includes a pair of diodes coupled in parallel with each other and an inductor coupled in series with one of the pair of diodes.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. An electrostatic discharge (ESD) circuit, adaptive to a radio frequency (RF) device, which includes a RF circuit coupled between a VDD power rail and a VSS power rail and having a RF I/O pad, the ESD circuit comprising:
    an ESD clamp circuit coupled between a VDD power rail node and the VSS power rail node; and
    a LC-tank structure coupled between the VDD power rail and the VSS power rail nodes and to the RF I/O pad, wherein the LC-tank structure includes a first ESD block between the VDD power rail node and the RF I/O pad, and a second ESD block between the VSS power rail node and the RF I/O pad, wherein at least one of the first and second ESD blocks includes a pair of diodes coupled in parallel with each other and an inductor coupled in series with one of the pair of diodes.

2. The ESD circuit of claim 1, wherein the first ESD block includes the pair of diodes coupled in parallel with each other and the inductor coupled in series with one of the pair of diodes, and wherein the second ESD block includes a single diode coupled between the RF I/O pad and the VSS power rail node.

3. The ESD circuit of claim 2, wherein the inductor is adapted to compensate for parasitic capacitance induced at the I/O pad by the LC-tank structure.

4. The ESD circuit of claim 2, wherein the one of the pair of diodes has a cathode coupled to the VDD power rail node and an anode coupled to the inductor.

5. The ESD circuit of claim 2, wherein the one of the pair of diodes has an anode coupled to the I/O pad and a cathode coupled to the inductor.

6. The ESD circuit of claim 1, wherein the second ESD block includes the pair of diodes coupled in parallel with each other and the inductor coupled in series with one of the pair of diodes, and wherein the first ESD block includes a single diode coupled between the RF I/O pad and the VSS power rail node.

7. The ESD circuit of claim 6, wherein the inductor is adapted to compensate for parasitic capacitance induced at the I/O pad by the LC-tank structure.

8. The ESD circuit of claim 6, wherein the one of the pair of diodes has a cathode coupled to the inductor and an anode coupled to the VSS power rail node.

9. The ESD circuit of claim 6, wherein the one of the pair of diodes has an anode coupled to inductor and a cathode coupled to the I/O pad.

10. The ESD circuit of claim 1, wherein both the first and second ESD blocks each include a pair of diodes coupled in parallel with each other and an inductor coupled in series with one of the pair of diodes.

11. The ESD circuit of claim 10, wherein the inductor of the first ESD block and the inductor of the second ESD block are adapted to compensate for parasitic capacitance induced at the I/O pad by the first and second ESD blocks, respectively.

12. The ESD circuit of claim 1, wherein the other of the pair of diodes has a parasitic capacitance forming a capacitor portion of an LC circuit with the inductor.

13. A radio frequency (RF) device comprising:

a circuit coupled between a VDD power rail and a VSS power rail and having a RF I/O pad;

an ESD clamp circuit coupled between the VDD power rail and the VSS power rail; and a LC-tank structure coupled between the VDD power rail and the VSS power rail and between the RF I/O pad and the RF circuit, wherein the LC-tank structure includes a first ESD block between the VDD power rail and the RF I/O pad, and a second ESD block between the VSS power rail and the RF I/O pad, wherein at least one of the first and second ESD blocks includes a pair of diodes coupled in parallel with each other and an inductor coupled in series with one of the pair of diodes.

14. The ESD circuit of claim 13, wherein the other of the pair of diodes has a parasitic capacitance forming a capacitor portion of an LC circuit with the inductor.

15. The ESD circuit of claim 13, wherein the first ESD block includes the pair of diodes coupled in parallel with each other and the inductor coupled in series with one of the pair of diodes, and wherein the second ESD block includes a single diode coupled between the RF I/O pad and the VSS power rail.

16. The ESD circuit of claim 15, wherein the inductor is adapted to compensate for parasitic capacitance induced at the I/O pad by the LC-tank structure.

17. The ESD circuit of claim 13, wherein the second ESD block includes the pair of diodes coupled in parallel with each other and the inductor coupled in series with one of the pair of diodes, and wherein the first ESD block includes a single diode coupled between the RF I/O pad and the VSS power rail.

18. The ESD circuit of claim 17, wherein the inductor is adapted to compensate for parasitic capacitance induced at the I/O pad by the LC-tank structure.

19. The ESD circuit of claim 13, wherein both the first and second ESD blocks each include a pair of diodes coupled in parallel with each other and an inductor coupled in series with one of the pair of diodes.

20. The ESD circuit of claim 19, wherein the inductor of the first ESD block and the inductor of the second ESD block are adapted to compensate for parasitic capacitance induced at the I/O pad by the first and second ESD blocks, respectively.

* * * * *